United States Patent
Yamashita

(10) Patent No.: US 6,625,429 B1
(45) Date of Patent: Sep. 23, 2003

(54) MOBILE RADIO COMMUNICATION APPARATUS

(75) Inventor: Osamu Yamashita, Tokyo (JP)

(73) Assignee: NEC Corporation, Tokyo (JP)

( * ) Notice: Subject to any disclaimer, the term of this patent is extended or adjusted under 35 U.S.C. 154(b) by 490 days.

(21) Appl. No.: 09/609,255

(22) Filed: Jun. 30, 2000

(30) Foreign Application Priority Data

Jul. 2, 1999 (JP) .......................................... 11-188513

(51) Int. Cl.$^7$ .............................................. H01Q 11/12
(52) U.S. Cl. ................. 455/126; 455/240.1; 455/250.1; 330/278
(58) Field of Search ................................ 455/126, 127, 455/115, 232.1, 240.1, 234.1, 234.2, 235.1, 246.1, 250.1, 249.1; 375/297, 311, 312; 330/2, 134, 129, 279, 278, 131

(56) References Cited

U.S. PATENT DOCUMENTS

| | | | |
|---|---|---|---|
| 5,036,527 A | * 7/1991 | Halim et al. .................. | 375/345 |
| 5,150,075 A | * 9/1992 | Hietala et al. ............... | 330/279 |
| 5,199,110 A | * 3/1993 | Adachi ........................ | 455/126 |
| 5,214,393 A | 5/1993 | Aihara ........................ | 330/279 |
| 5,278,994 A | * 1/1994 | Black et al. ................. | 455/126 |
| 5,283,533 A | 2/1994 | Hori ............................. | 330/2 |
| 5,334,979 A | * 8/1994 | Hatakeyama ............... | 341/138 |
| 5,509,011 A | * 4/1996 | Birth ........................... | 370/498 |
| 5,761,251 A | * 6/1998 | Wender ...................... | 375/345 |
| 5,955,925 A | * 9/1999 | Segawa et al. ............. | 330/279 |
| 6,389,272 B1 | * 5/2002 | Horigome et al. ......... | 455/234.1 |
| 6,430,402 B1 | * 8/2002 | Agahi-Kesheh ............. | 455/115 |

FOREIGN PATENT DOCUMENTS

| | | |
|---|---|---|
| GB | 2 073 977 | 10/1981 |
| GB | 2 263 027 | 7/1993 |
| JP | 57-113634 | 7/1982 |
| JP | 58-129706 | 9/1983 |
| JP | 61-18644 | 2/1986 |
| JP | 61-131917 | 6/1986 |
| JP | 4-100427 | 4/1992 |
| JP | 5-29968 | 2/1993 |
| JP | 5-48357 | 2/1993 |
| JP | 9-36684 | 2/1997 |
| JP | 10-145160 | 5/1998 |
| JP | 11-127084 | 5/1999 |
| JP | 2000-101456 | 4/2000 |
| JP | 2000-349657 | 12/2001 |

* cited by examiner

*Primary Examiner*—Charles N. Appiah
(74) *Attorney, Agent, or Firm*—Foley & Lardner

(57) ABSTRACT

A mobile radio communication apparatus comprises a power amplifier (102) for power-amplifying a transmission signal (103) into an amplified transmission signal which is transmitted through an antenna (101). A high-sensitivity detector (105) high-sensitivity detects the amplified transmission signal. The high-sensitivity detection signal is limited by a diode (107) to a predetermined voltage to be produced as a first output voltage signal. A low-sensitivity detector (110) low-sensitivity detects the amplified transmission signal. A predetermined offset voltage is superposed on the low-sensitivity detection signal to be produced as a second output voltage signal. The first and the second output voltage signals are combined into a combined output signal. A comparator (118) compares the combined output signal with a transmission ramp production signal supplied from a mobile radio communication apparatus control section. With reference to a comparison result, a dynamic range of the power amplifier is controlled.

14 Claims, 2 Drawing Sheets

MOBILE RADIO COMMUNICATION APPARATUS

BACKGROUND OF THE INVENTION

This invention relates to a mobile radio communication apparatus and, in particular, to a control technique of controlling a transmission output of a mobile radio communication apparatus used in a TDMA (Time Division Multiple Access) mobile radio communication system.

Generally, in a pan-European mobile telephone system GSM (Global System for Mobile communication), it is attempted to reduce the size of a communication cell (communication area) in order to enhance communication traffic. In a mobile communication apparatus, it is required to reduce an output of a transmission power. If the communication cell is reduced in size a high transmission output would result in a widened dynamic range of transmission output control. In case of a "transmission power sensing system" which has been adopted, this results in expansion of a dynamic range of a detector. As a consequence, it is difficult to detect the transmission output used upon transmission output control.

Typically, the detector comprises a single diode. It is difficult for such detector to cover a detection range of the transmission output Therefore, instead of the control system for detecting the transmission output to perform feedback control, use is also made of a control system for detecting an electric current flowing into a current amplifying circuit to perform feedback control upon the current amplifying circuit.

In such a transmission current sensing system, it is difficult to compensate the variation in power amplifier efficiency at different conditions (for example, temperature, power supply voltage channel frequency). Under the circumstances, the mobile radio communication apparatus is provided with a memory table for software-based correction of the transmission output. However, if the transmission output is corrected by the use of the memory table, the number of items in adjustment upon manufacture of the mobile radio communication apparatus is increased. In addition, a large-capacity memory is required.

SUMMARY OF THE INVENTION

It is an object of this invention to provide a mobile radio communication apparatus which is capable of readily correcting a transmission output.

According to this invention, there is provided a mobile radio communication apparatus comprising:

a control section for producing a baseband transmission signal and a transmission ramp production signal having a ramp waveform;

a radio section for converting the baseband transmission signal into a radio frequency transmission signal;

a power amplifier supplied with the radio frequency transmission signal for power-amplifying the radio frequency transmission signal into an amplified transmission signal which is transmitted through an antenna, the power amplifier having a dynamic range controlled with reference to the amplified transmission signal;

first detecting means having a first detection sensitivity and responsive to the amplified transmission signal for detecting the amplified transmission signal at the first detection sensitivity to produce a first output voltage signal;

second detecting means having a second detection sensitivity lower than the first detection sensitivity and responsive to the amplified transmission signal for detecting the amplified transmission signal at the second detection sensitivity to produce a second output voltage signal;

combining means for combining the first output voltage signal with the second output voltage signal to produce a combined output signal; and comparing means supplied with the combined output signal for comparing the combined output signal with the transmission ramp production signal to produce a comparison result signal and for controlling the dynamic range of the power amplifier with reference to the comparison result signal.

The first detecting means comprises high-sensitivity detecting means for high-sensitivity detecting the amplified transmission signal to obtain a high-sensitivity detection signal and voltage limiting means for limiting a voltage of the high-sensitivity detection signal to a predetermined voltage to produce the first output voltage signal.

The voltage limiting means comprises a diode connected in parallel to the high-sensitivity detecting means.

The second detecting means comprises low-sensitivity detecting means for low-sensitivity detecting the amplified transmission signal to obtain a low-sensitivity detection signal and offset voltage superposing means for superposing a predetermined offset voltage upon the low-sensitivity detection signal to produce the second output voltage signal.

The offset voltage superposing means comprises an offset voltage source to produce the predetermined offset voltage, resistor means connected to an output of the low-sensitivity detecting means and to the offset voltage source to produce the low-sensitivity detection signal with the predetermined offset voltage superposed thereon, and operational amplifier means responsive to the low-sensitivity detection signal with the predetermined offset voltage superposed thereon for obtaining the second output voltage signal.

The comparing means comprises a comparator for comparing the combined output signal with the transmission ramp production signal to produce the comparison result signal which is supplied to a power control terminal of the power amplifier so that the dynamic range of the power amplifier is controlled with reference to the comparison result signal.

DESCRIPTION OF THE PREFERRED EMBODIMENT

Figure 1:
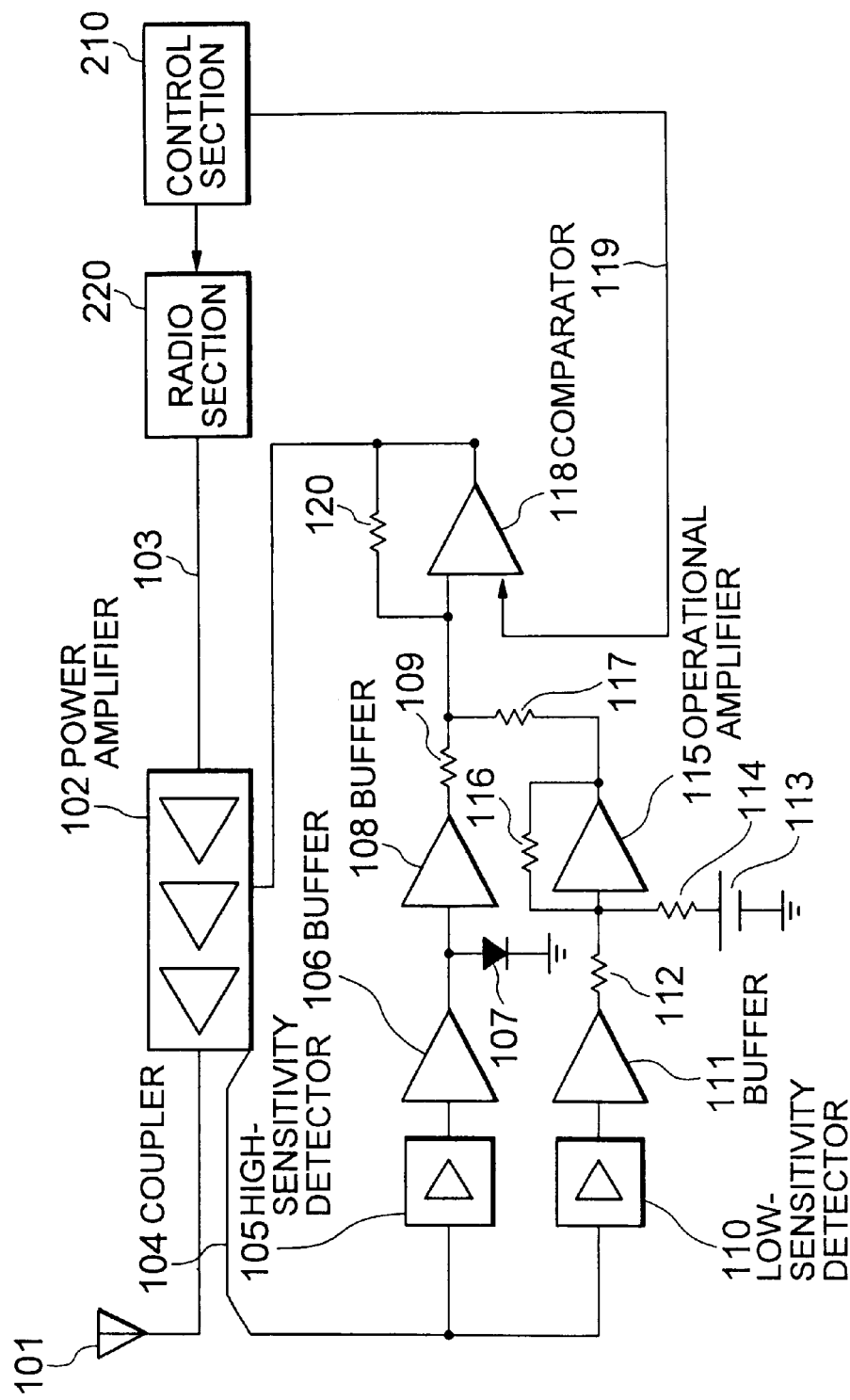
FIG. 1 is a block diagram of a mobile radio communication apparatus according to an embodiment of this invention.

Now, description will be made about this invention with reference to the drawing.

Referring to FIG. 1, a mobile radio communication apparatus has a control section 210 for producing a baseband transmission signal and a radio section 220 for converting the baseband transmission signal into an RF (Radio Frequency) signal as a transmission signal 103. The transmission signal 103 is supplied to a power amplifier 102. The power amplifier 102 power-amplifies the transmission signal 103 to produce an amplified transmission signal which is transmitted through an antenna 101.

The amplified transmission signal produced by the power amplifier 102 is controlled with time in the following manner. A part of the amplified transmission signal is extracted by a coupler 104 and supplied to a detection circuit section. The detection circuit section comprises a high-sensitivity detector 105 and a low-sensitivity detector 110. The high-sensitivity detector 105 and the low-sensitivity detector 110 carry out envelope detection to produce a high-sensitivity detection signal and a low-sensitivity detection signal, respectively. The high-sensitivity detector 105 is connected to a buffer 106 in series. Likewise, the low-sensitivity detector 110 is connected to a buffer 111 in series.

The high-sensitivity detection signal is supplied to the buffer 106 The buffer 106 has an output connected to a diode 107 in parallel with respect to a ground potential. The diode 107 serves to prevent the buffer 106 from producing a voltage higher than a conduction voltage at which the diode 107 is electrically conducted. In other words, the buffer 108 is supplied with a voltage equal to or lower than the conduction voltage of the diode 107.

The low-sensitivity detection signal is supplied to the buffer 111. An output of the buffer 111 is supplied through a resistor 112 to an operational amplifier 115. Furthermore, an offset voltage 113 is supplied through a resistor 114 to the operational amplifier 115. A resistor 116 serves as a feedback resistor The offset voltage 113 has a level equal to that of the conduction voltage of the diode 107.

An output of the buffer 108 and an output of the operational amplifier 115 pass through resistors 109 and 117, respectively, to be combined into a combined voltage signal which is supplied to a comparator 118. The comparator 118 is also supplied with a transmission ramp production signal 119 from the control section 210. The comparator 118 compares the combined voltage signal and the transmission ramp production signal 119 to produce a comparison result signal. The comparison result signal is fed back through a resistor 120 to an input of the comparator 118 and fed back to a power control terminal of the power amplifier 102. The power amplifier 102 produces an output signal controlled with reference to the comparison result signal.

Figure 2:
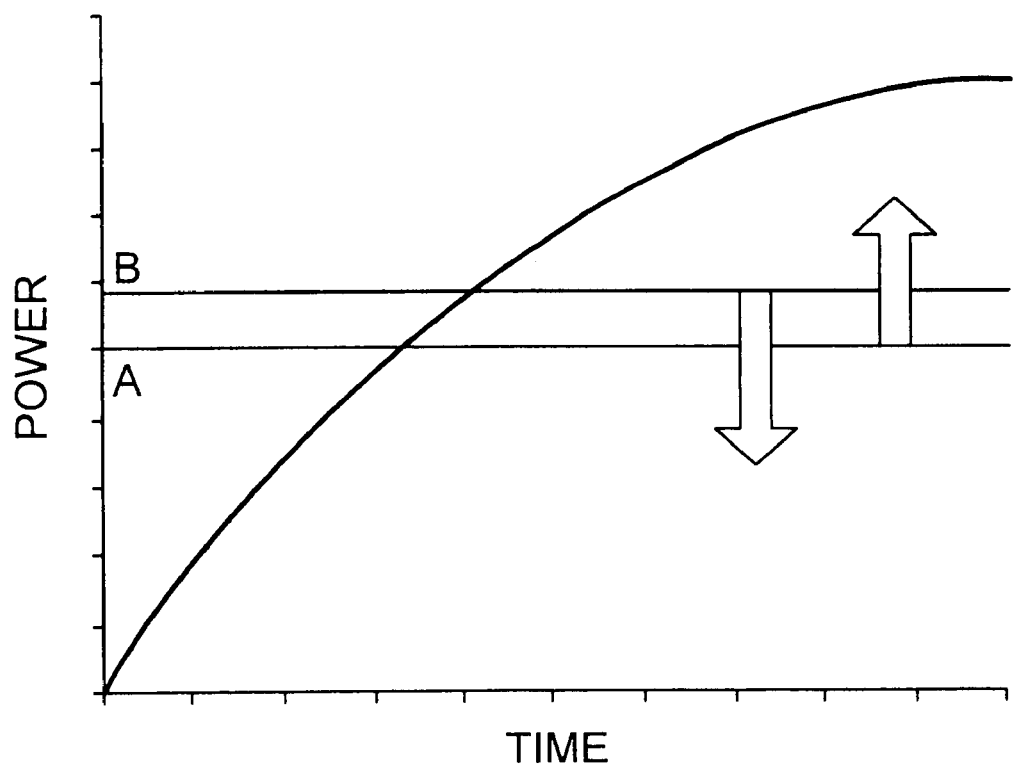
FIG. 2 is a view showing the relationship between a transmission power and time.

FIG. 2 shows a rise of the output power of the transmission signal with time.

Referring to FIG. 2 in addition to FIG. 1, the output power of the transmission signal must be controlled with time as illustrated in FIG. 2 in accordance to the transmission ramp production signal 119 having a ramp waveform or voltage. The ramp waveform is like a waveform shown in FIG. 2. If the output power is lower than a level A in FIG. 2, the high-sensitivity detector 105 produces an output voltage and the buffer 106 alone produces an envelope detection signal. At this time, the low-sensitivity detector 110 having a low sensitivity does not produce a detection signal when the output power is lower than the level A. Therefore, if the output power is lower than the level A, the envelope detection signal (high-sensitivity detection signal) of the buffer 106 is supplied through the buffer to the comparator 118. As described above, the comparator 118 compares the transmission ramp production signal 119 and the high-sensitivity detection signal to produce the comparison result signal representative of the difference therebetween. The comparison signal is supplied to the power control terminal of the power amplifier 102.

When the output power reaches the level A, the low-sensitivity detector 110 starts production of the low-sensitivity detection signal The low-sensitivity detection signal is supplied through the buffer 111 to the operational amplifier 115. The operational amplifier 115 produces a superposed voltage signal obtained by superposing the offset voltage 113 upon the low-sensitivity detection signal. Following the start of production of the low-sensitivity detection signal, the output voltage of the buffer 106 approaches the conduction voltage of the diode 107 so that an electric current gradually flows through the diode 107. As described above, the output voltage of the buffer 106 does not exceed the conduction voltage of the diode 107.

The comparator 118 receives as the combined voltage signal the output voltage of the buffer 108 and the output voltage of the operational amplifier 115 through the resistor 109 and the resistor 117, respectively. The comparator 118 compares the transmission ramp production signal 119 and the combined voltage signal. As described above, the comparison result signal is supplied to the power control terminal of the power amplifier 102.

When the output power reaches a level B, the output voltage of the buffer 106 does not increase to a level higher than the conduction voltage of the diode 107. On the other hand, the operational amplifier 115 continuously produces the envelope detection signal (superposed voltage signal) obtained by superposing the offset voltage 113 upon the low-sensitivity detection signal. Therefore, the output voltage (superposed voltage signal) of the operational amplifier 115 is predominant as a voltage supplied to the comparator 118.

As described above, according to this invention, control of the transmission signal power is carried out by the use of the high-sensitivity and the low-sensitivity detectors in combination. Therefore, the dynamic range of envelope detection is widened and the transmission output can easily be corrected.

In addition, according to this invention, the voltage limiter is connected to the output of the high-sensitivity detector and the bias voltage is superposed on the low-sensitivity detector. Therefore, it is possible to automatically switch the outputs of the high-sensitivity and the low-sensitivity detectors.

The saturation voltage of the high-sensitivity detector and the output production start voltage of the low-sensitivity detector coincide with each other. Therefore, switching between the high-sensitivity and the low-sensitivity detectors can be smoothly carried out.

What is claimed is:

1. A mobile radio communication apparatus comprising:
   a control section for producing a baseband transmission signal and a transmission ramp production signal having a ramp waveform;
   a radio section for converting said baseband transmission signal into a radio frequency transmission signal;
   a power amplifier supplied with said radio frequency transmission signal for power-amplifying said radio frequency transmission signal into an amplified transmission signal which is transmitted through an antenna, said power amplifier having a dynamic range controlled with reference to said amplified transmission signal;
   first detecting means having a first detection sensitivity and responsive to said amplified transmission signal for detecting said amplified transmission signal at said first detection sensitivity to produce a first output voltage signal;
   second detecting means having a second detection sensitivity lower than said first detection sensitivity and responsive to said amplified transmission signal for detecting said amplified transmission signal at said second detection sensitivity to produce a second output voltage signal;

combining means for combining said first output voltage signal with said second output voltage signal to produce a combined output signal; and comparing means supplied with said combined output signal for comparing said combined output signal with said transmission ramp production signal to produce a comparison result signal and for controlling the dynamic range of said power amplifier with reference to said comparison result signal.

2. A mobile radio communication apparatus as claimed in claim 1, wherein said first detecting means comprises high-sensitivity detecting means for high-sensitivity detecting said amplified transmission signal to obtain a high-sensitivity detection signal and voltage limiting means for limiting a voltage of said high-sensitivity detection signal to a predetermined voltage to produce said first output voltage signal.

3. A mobile radio communication apparatus as claimed in claim 2, wherein said voltage limiting means comprises a diode connected in parallel to said high-sensitivity detecting means.

4. A mobile radio communication apparatus as claimed in claim 2, wherein said second detecting means comprises low-sensitivity detecting means for low-sensitivity detecting said amplified transmission signal to obtain a low-sensitivity detection signal and offset voltage superposing means for superposing a predetermined offset voltage upon said low-sensitivity detection signal to produce said second output voltage signal.

5. A mobile radio communication apparatus as claimed in claim 4, wherein said offset voltage superposing means comprises an offset voltage source to produce said predetermined offset voltage, resistor means connected to an output of said low-sensitivity detecting means and to said offset voltage source to produce the low-sensitivity detection signal with said predetermined offset voltage superposed thereon, and operational amplifier means responsive to the low-sensitivity detection signal with said predetermined offset voltage superposed thereon for obtaining said second output voltage signal.

6. A mobile radio communication apparatus as claimed in claim 1, wherein said comparing means comprises a comparator for comparing said combined output signal with said transmission ramp production signal to produce said comparison result signal which is supplied to a power control terminal of said power amplifier so that the dynamic range of said power amplifier is controlled with reference to said comparison result signal.

7. A mobile radio communication apparatus as claimed in claim 1, wherein said first detecting means produces the first output voltage signal that is limited to be no higher than a first output value even when said amplified transmission signal exceeds a first input value, and wherein said second detecting means produces the second output voltage signal only when said amplified transmission signal exceeds the first input value.

8. A mobile radio communication apparatus comprising:

a control section for producing a baseband transmission signal and a transmission ramp production signal having a ramp waveform;

a radio section for convening said baseband transmission signal into a radio frequency transmission signal;

a power amplifier supplied with said radio frequency transmission signal for power-amplifying said radio frequency transmission signal into an amplified transmission signal which is transmitted through an antenna, said power amplifier having a dynamic range controlled with reference to said amplified transmission signal;

first detecting means having a first detection sensitivity and responsive to said amplified transmission signal for detecting said amplified transmission signal at said first detection sensitivity to produce a first output voltage signal;

second detecting means having a second detection sensitivity lower than said first detection sensitivity and responsive to said amplified transmission signal for detecting said amplified transmission signal at said second detection sensitivity to produce a second output voltage signal;

combining means for combining said first output voltage signal with said second output voltage signal to produce a combined output signal; and comparing means supplied with said combined output signal for comparing said combined output signal with said transmission ramp production signal to produce a comparison result signal and for controlling the dynamic range of said power amplifier with reference to said comparison result signal, wherein said second detecting means comprises low-sensitivity detecting means for low-sensitivity detecting said amplified transmission signal to obtain a low-sensitivity detection signal and offset voltage superposing means for superposing a predetermined offset voltage upon said low-sensitivity detection signal to produce said second output voltage signal.

9. A mobile radio communication apparatus comprising:

a control section for producing a baseband transmission signal and a transmission ramp production signal having a ramp waveform;

a radio section for converting said baseband transmission signal into a radio frequency transmission signal;

a power amplifier supplied with said radio frequency transmission signal for power-amplifying said radio frequency transmission signal into an amplified transmission signal which is transmitted through an antenna, said power amplifier having a dynamic range controlled with reference to said amplified transmission signal;

a first detecting unit having a first detection sensitivity and responsive to said amplified transmission signal, said first detecting unit configured to detect said amplified transmission signal at said first detection sensitivity to produce a first output voltage signal;

a second detecting unit having a second detection sensitivity lower than said first detection sensitivity and responsive to said amplified transmission signal, said second detecting unit configured to detect said amplified transmission signal at said second detection sensitivity to produce a second output voltage signal;

a combining unit configured to combine said first output voltage signal with said second output voltage signal to produce a combined output signal; and a comparing unit supplied with said combined output signal, said comparing unit configured to compare said combined output signal with said transmission ramp production signal to produce a comparison result signal and for controlling the dynamic range of said power amplifier with reference to said comparison result signal.

10. A mobile radio communication apparatus as claimed in claim 9, wherein said first detecting unit comprises:

a high-sensitivity detecting unit configured to high-sensitivity detect said amplified transmission signal to obtain a high-sensitivity detection signal; and a voltage limiting unit configured to limit a voltage of said high-sensitivity detection signal to a predetermined voltage to produce said first output voltage signal.

11. A mobile radio communication apparatus as claimed in claim 10, wherein said voltage limiting unit comprises a diode connected in series to said high-sensitivity detecting unit.

12. A mobile radio communication apparatus as claimed in claim 10, wherein said second detecting unit comprises:

a low-sensitivity detecting unit configured to low-sensitivity detect said amplified transmission signal to obtain a low-sensitivity detection signal; and an offset voltage superposing unit configured to superpose a id a predetermined offset voltage upon said low-sensitivity detection signal to produce said second output voltage signal.

13. A mobile radio communication apparatus as claimed in claim 12, wherein said offset voltage superposing unit comprises:

an offset voltage source to produce said predetermined offset voltage;

a resistor unit connected to an output of said low-sensitivity detecting unit and to said offset voltage source, said resistor unit configured to produce the low-sensitivity detection signal with said predetermined offset voltage superposed thereon; and an operational amplifier unit responsive to the low-sensitivity detection signal with said predetermined offset voltage superposed thereon, said operational amplifier configured to obtain said second output voltage signal.

14. A mobile radio communication apparatus as claimed in claim 9, wherein said comparing unit compares said combined output signal with said transmission ramp production signal to produce said comparison result signal which is supplied to a power control terminal of said power amplifier so that the dynamic range of said power amplifier is controlled with reference to said comparison result signal.

* * * * *